United States Patent [19]

Gilloire et al.

[11] 4,319,082

[45] Mar. 9, 1982

[54] ADAPTIVE PREDICTION DIFFERENTIAL-PCM TRANSMISSION METHOD AND CIRCUIT USING FILTERING BY SUB-BANDS AND SPECTRAL ANALYSIS

[76] Inventors: André Gilloire, 7, rue Yann Peron; Jean Zurcher, 10, rue du Dauphiné, both of 22300 Lannion, France

[21] Appl. No.: 103,582

[22] Filed: Dec. 14, 1979

[30] Foreign Application Priority Data

Dec. 28, 1978 [FR] France .................. 78 36709

[51] Int. Cl.³ .............................................. G10L 1/00
[52] U.S. Cl. ............................ 179/1 SA; 179/15.55 R
[58] Field of Search ........... 179/15.55 R, 1 SA, 1 SC; 375/27, 30; 358/133, 135; 332/11 D; 340/347 AD

[56] References Cited

U.S. PATENT DOCUMENTS

| | | | |
|---|---|---|---|
| 3,973,081 | 8/1976 | Hutchins | 179/15.55 R |
| 3,973,199 | 8/1976 | Widmer | 375/30 |
| 4,017,849 | 4/1977 | Tewksbury | 375/27 |
| 4,125,861 | 11/1978 | Mounts et al. | 358/133 |

Primary Examiner—Edward J. Wise
Assistant Examiner—E. S. Kemeny

[57] ABSTRACT

Adaptive differential PCM system using both adaptive quantization and adaptive prediction. The adaptive prediction is carried out in adjacent frequency bands on as many signals as are obtained by weighting the quantized signal by coefficients obtained by spectral analysis in the bands of the quantized signal.

8 Claims, 4 Drawing Figures

4,319,082

ADAPTIVE PREDICTION DIFFERENTIAL-PCM TRANSMISSION METHOD AND CIRCUIT USING FILTERING BY SUB-BANDS AND SPECTRAL ANALYSIS

BACKGROUND OF THE INVENTION

The present invention relates to an adaptive prediction differential-PCM tranmission method and circuit. It is intended for use more particularly in telecommunications and particularly telephony.

The PCM technique (pulse-code modulation) is now widely used in the telecommunications field and in particular in telephone transmissions. This technique essentially comprises on transmission the sampling of the signal to be transmitted and then the quantization of the samples obtained, the coding of the quantized signals in digital form and finally the transmission of the coded signals, and on reception the decoding of the signal received, which supplies a sequence of samples from which the original signal is reconstituted.

At present, most International and National telephone networks use this technique. However, despite its considerable interest, it suffers from the disadvantage of necessitating a high information flow rate, which is of the order of 64 kbits/s (kilobits per second). Naturally, a considerable advance would be provided by reducing this flow rate, for example to 32 kbits/s, provided that the transmission quality was equal. However, this reduction is possible if account is taken of the intrinsic properties of the signal to be transmitted, which on this occasion is the speech signal.

Two categories of methods fulfilling this condition and which improve the PCM technique are known. These methods are called "differential coding" and "sub-bands". For a detailed description of these methods, reference should be made to the article by N. J. JAYANT, entitled "Digital Coding of Speech Waveforms: PCM, DPMC and DM Quantizers", published in the Journal "Proceedings of IEEE", May 1974, pp. 22 to 42. A brief description will be given of the principle of these two methods and thereby will facilitate understanding of the invention.

In the method using differential coding, the sampled input signal is not quantized, but instead the difference between this signal and a sample is predicted from the evolution of this difference.

The circuit diagram of a differential-PCM circuit is shown in FIG. 1. The part corresponding to the coding operation comprises an input 10 to which is applied a sampled signal $S_n$, a subtractor 12, having two inputs, one receiving the signal $S_n$ and the other a predicted signal $\hat{S}_n$, said subtracter having an output which supplies a differential signal $d_n$, a quantizer 14 which supplies a quantized signal $d'_n$ which is then digitally coded by a coding circuit 16, an adder 18 which receives the quantized signal $d'_n$ and the predicted signal $\hat{S}_n$ and which supplies a signal $S'_n$ and a predictor circuit 20 which receives the signal $S'_n$ and supplies the predicted signal $\hat{S}_n$.

The part corresponding to the decoding operation comprises a decoding circuit 24 receiving the digital signal transmitted and supplying a signal $d'_n$, an adder 26 having two inputs, one receiving the signal $d'_n$ and the other a predicted signal $\hat{S}_n$, said adder supplying a signal $S'_n$ and a predictor circuit 28 receiving the signal $S'_n$ and supplying the predicted signal $\hat{S}_n$.

In the diagram of FIG. 1 (as in the diagrams to be described hereinafter) the means for sampling the signal to be transmitted are not shown and it is assumed that the input signal is constituted by the sequence of samples $S_n$. In addition, the signal transmission and reception means and the signalling means are not shown, because they are well known in the art and do not form part of the present invention.

In the following description, the notations used in the first drawing will be retained, namely the use of a symbol n giving the order of the sampled signals, the letter d (optionally with an apostrophe) for the differential signals and the letter S (optionally with an apostrophe) for the other signals, the circumflex accent being used for marking the prediction signals.

The differential-PCM method is of particular interest when the differential signal $d_n$ is smaller than the input signal $S_n$, because then the quantization noise decreases compared with $S_n$ and the signal/noise ratio improves. For this condition to be fulfilled, it is necessary that the predicted signal $\hat{S}_n$ is as close as possible to the input signal $S_n$, assuming that the latter is predictable.

This is precisely the case for the speech signal, particularly for human speech sounds, whose spectral and time evolutions are relatively slow. In general terms, the correlation between successive samples increases in inverse proportion to the dominant frequencies compared with the sampling frequency.

However, for the speech signal, the sampling frequency is generally equal to or above 8 kHz and the average longterm spectrum of speech has a maximum at around 500 Hz. Thus, conditions of good predictability exist.

In the differential PCM method, quantization can be carried out with a number of bits. For example, 4 bits are used for a sampling frequency of 8 kHz, corresponding to an information flow rate of 32 kBits/s. However, in a special variant called "Δ coding", quantization is carried out with only a single bit for each sample, for which only the differential signal sign is used. However, as a counterpart to this reduction in the number of bits, the sampling frequency must be increased (and rises to 32 kHz if it is desired to retain the flow rate of 32 kbits/s).

In such a transmission system, the continuous modifications of the speech signal and the high dynamics of this signal lead to a considerable dispersion of the instantaneous levels occupied by differential signal $d_n$. It is conventional practice to ensure a good adaptation between the high dispersion signal and the quantizer processing the same by multiplying the differential signal $d_n$ by a gain factor $G_n$ in such a way that the signal produced $d_n.G_n$ which is processed by the quantizer, makes optimum use of the levels available therein. After quantization, the quantized signal is divided by the same factor $G_n$ in order to reobtain the original quantized sample $d'_n$. The gain factor $G_n$ can be determined on the basis of an analysis of the levels occupied by the quantized signal $d'_n.G_n$. This factor is reduced if $d'_n.G_n$ occupies too high levels and is reduced if $d'_n.G_n$ occupies too low levels.

A circuit diagram of a differential-PCM circuit provided with means for adapting the dynamics of the input signal is shown in FIG. 2 where the same elements as in FIG. 1 carry, for simplification purposes, the same references. In addition to the common elements, this circuit comprises firstly in the coding stage a multiplier 30 for the gain $G_n$ which receives the differential signal dn, a circuit 32 able to calculate the gain Gn+1 necessary for the processing of the following sample and this calculation being based upon the signal d'n. Gn supplied by the quantizer 14, a circuit 34 for dividing by Gn placed between the quantizer 14 and an adder 18; and in the decoding stage a divider 36 by Gn inserted between the decoder 24 and the adder 26, and a circuit 38 for calculating the gain gn+1.

Circuits able to calculate the gain Gn+1 for a sample of order n+1 from the sample value of order n are well known to the those skilled in the art and will not be described here.

In a differential-PCM system, the prediction circuit, whose function is to supply a predicted signal $\hat{S}n$ from a differential signal d'n, generally comprises a linear filter which, from a sequence of samples prior to the sample of order n, is able to give a prediction for the sample of order n.

Such a predictor filter can be calculated once and for all and is this case its characteristics are selected so that it is well adapted or matched to the long-term average spectrum of the signal to be transmitted. However, this type of filter does not make it possible to obtain a very good quality and in general 24 to 26 dB of the signal/noise ratio. For the 64 kbit/s PCM system, this ratio can reach 38 dB and must, in operation, always exceed 33.5 dB. It is known that such ratios can be measured by the isopreference method, which consists of alternately listening to coded phrases and the same phrases in the uncoded state on which are superimposed a multiplicative white noise, which is adjusted so that the same noise impression is obtained for both signals.

The transmission quality of a differential-PCM system can be improved by adapting the predictor filter to the evolutions of the signal in time, by a periodic updating of its characteristics. This adaptation can either be carried out on an overall basis or sequentially. It is carried out on an overall basis by calculating on sample blocks (chosen sufficiently short to enable the signal to be considered as stationary and in practice of the order of 20 ms) the filter most suitable for each signal band. This method has the double disadvantage of introducing a systematic delay corresponding to the length of the sample block used and of necessitating the transmission to the reception stage of information coefficients relative to the filter used in the transmission stage. This systematic delay and this supplementary transition mean that this method cannot be considered for modern telephony. The alternative is sequential adaptation by correcting at each sampling instant the characteristics of the filter in accordance with the differential signal value at this instant. This sequential method has the disadvantage of being difficult to perform, without any great resulting improvement over a fixed prediction (the gain is only 2 to 3 dB). Such a technique is described in the article by J. D. GIBSON entitled "Sequentially Adaptive Backward Predication in ADPCM Speech Coders", published in the Journal "IEEE Transactions on Communications", vol. COM-26, No. 1, January 1978.

As regards the second category of transmission methods, in which account is taken of the special properties of the signal to be transmitted, the coding is accomplished by sub-bands method. This consists of filtering the signal to be transmitted in adjacent band pass filters, the output of each filter being transposed in the corresponding base band, then filtering the signals corresponding to each sub-band with a frequency which is double the band width. In this connection, reference can be made to the article by R. E. CROCHIERE et al, entitled "Digital Coding of Speech in Sub-Bands", published in the Journal "The Bell System Technical Journal", October 1976, pp. 1069 to 1085.

Such a method has two advantages in that for each sub-band, the quantization noise remaining limited to said band is strictly correlated to the signal and is therefore subjectively only very slightly disturbing. Moreover, the information flow rate attributed to each band can be modified as a function of the evolution of energies in said band.

However, this method also has two disadvantages. The construction of band pass filters and the scaling of the quantizers imply significant delays (of the order of 12 to 16 ms) which are incompatible with use in a telephone system. Finally, this method requires the parallel transmission of the scaling coefficients of the quantizers, so that multiplexing is relatively complicated.

BRIEF SUMMARY OF THE INVENTION

The invention relates to a transmission method and a circuit for performing the same making it possible to obtain the advantages of an adaptive prediction differential-PCM system and those of the system by coding by sub-bands, without having the disadvantages of either of the systems. In particular, the invention causes no delay in the transmission and requires no ancillary transmission.

These objects are achieved by the use in accordance with the present invention of a prediction which is obtained by band pass filtering in a plurality of adjacent bands covering the telephone band, the filtering being carried out on a signal which is weighted by means of coefficients obtained by spectral analysis of the differential signal. This has two fundamental consequences: As a result of the spectral analysis, the predictor filter according to the invention is at all times matched to the signal to be transmitted. Thus, the predictor filter follows the spectral evolution of this signal, and the best possible adaptation is ensured, even if the input signal can only be predicted to a very limited extent.

As in the prior art coding by sub-bands, if there is only energy in one band, the quantization noise is masked by the signal, so that the noted noise is minimal and, as in coding by sub-bands, the essential of the digital flow rate is concentrated on the band having the energy.

More specifically, the invention relates to a transmission method of the adaptive prediction differential-PCM type in which:

(a) in a coding operation, a differential signal dn is formed between a sample Sn to be transmitted (n designating the order of the sample) and a signal $\hat{S}n$ which is predicted from the evolution of the differential signal dn, the latter is multiplied by a factor Gn, the signal dn.Gn is quantized giving a quantized signal d'n.Gn, the factor Gn+1 is determined from the level occupied by the quantized signal d'n.Gn and the latter is coded;

(b) in a decoding operation, the coded signal is decoded which gives a quantized signal d'n.Gn, the factor Gn+1 is determined from the signal d'n.Gn, the latter is divided by a factor Gn to obtain a signal d'n, an aggregate signal S'n is formed between the signal d'n and a signal $\hat{S}n$ which is predicted from the evolution of said aggregate signal S'n; wherein, each prediction is carried out in adjacent frequency bands on as many signals as are obtained by weighting the quantized signal d'n by coefficients obtained by spectral analysis in the bands of the quantized signal $d'n.Gn$.

Preferably, adaptive prediction comprises the following operations:

a spectral analysis is performed on the quantized signal $d'n.Gn$ in a plurality of frequency bands $FA_i$, i designating the order of the band, the result of this analysis supplying the same signals $Ki$ as bands;

each signal $Ki$ is multiplied by the quantized signal $d'n$, each signal produced $d'n.Ki$ is filtered in a frequency band $FP_i$, the bands $FP_i$ having the same central frequency as the analysis bands $FA_i$, and the different bands $FP_i$ being adjacent; and all the signals obtained after filtering are summated, and the aggregate signal obtained constitutes the predicted signal $\hat{S}n$.

Preferably, each of the signals obtained after filtering in a band $FP_i$ is multiplied by a regulatable factor $g_i$, and each factor $g_i$ is regulated to obtain a maximum loop gain compatible with the stability of the system.

These weighting operations by $g_i$ are determined experimentally to give, in the presence of a frequency $f_i$, corresponding to the central frequency of the analysis filters $FA_i$ and predictor $FP_i$, the $Ki$ then having a maximum value equal to 1, the maximum prediction gain (i.e., the minimum amplitude signal $dn$) compatible with the stability of the system. In practice, $g_i$ is increased until the system becomes unstable and it is then slightly reduced to return to stability.

For stability reasons, the weighting factors are reduced when rank i increases. The more the frequency is increased, the more the phase displacement provided by the filters $FP_i$ rises and the more oscillation conditions in the loop are approached. The $g_i$ determined in this way give the predictor filter (when all the $Ki$ are equal) a transfer function which is very close to the average long-term spectrum of the speech signal.

Preferably, the analysis operation in a band is carried out by filtering the signal in this band and then by detection and low pass filtering. However, it is obvious that spectral analysis could be obtained in some other way for example, by Fourier analysis (analog or by sampling).

The invention also relates to a transmission circuit of the adaptive prediction differential-PCM type for performing the method described hereinbefore, the circuit being of the type which has:

(a) a coding circuit having a subtracter which receives a sample $Sn$ to be transmitted and a predicted signal $\hat{S}n$ from the differential signal $dn$ supplied by the subtracter, a multiplier by a factor $Gn$ receiving the signal $dn$ and supplying a signal $dn.Gn$, a predictor circuit receiving the differential signal $dn$ and supplying the predicted $\hat{S}n$, a quantizer circuit connected to the multiplier and supplying a quantized signal $d'n.Gn$, a circuit for calculating the factor $Gn+1$ connected to the output of the quantizer, a coding circuit receiving the signal $d'n.Gn$ and supplying a coded signal;

(b) a decoding circuit having a decoder receiving a coded signal supplying a signal $d'n.Gn$, a divider by a factor $Gn$ receiving the signal $d'n.Gn$ and supplying a signal $d'n$, a circuit for calculating the factor $Gn+1$ connected to the output of the decoder, an adder receiving the signal $d'n$ and a predicted signal $\hat{S}n$ and supplying an aggregate signal $S'n$, a predictor circuit receiving said aggregate signal $S'n$ and supplying the predicted signal $\hat{S}n$;

wherein each predictor circuit comprises:

a spectral analyser with a plurality of channels in parallel, each channel working in a frequency band $FA_i$, i designating the rank of the channel, or the inputs of the channels receiving the signal $d'n.Gn$, the outputs of these channels each having a signal $Ki$;

a predictor having the same number of prediction channels in parallel as the analysis circuit has channels, each prediction channel of rank i having a multiplier with two inputs, one receiving the signal $Ki$ and the other the quantized signal $d'n$, said multiplier being followed by a band pass prediction $FP_i$, the prediction bands having the same central frequency as the analysis bands and all being adjacent, the predictor also having an adder with two inputs connected to the output of each of the prediction channels, said adder supplying a signal which is the prediction signal $\hat{S}n$.

Preferably, each channel of the predictor has after the band pass filter $FP_i$ a multiplier by a factor $g_i$, the latter being regulated so as to obtain the maximum loop gain compatible with the stability of the system.

Preferably, each channel of the spectral analyser has a band pass filter followed by a rectifier and a low pass filter.

In this case, the filters $FP_i$ and filters $FA_i$ are band pass filters having the same central frequency and overvoltage coefficient (i.e. same band width at 3 dB). However, they do not necessarily have the same transfer function. However, it is possible to design identical filters for prediction and analysis.

BRIEF DESCRIPTION OF THE DRAWINGS

The invention is described in greater detail hereinafter relative to non-limitative embodiments and with reference to the attached drawings, wherein.

DETAILED DESCRIPTION OF THE PREFERRED EMBODIMENTS

Figure 1:
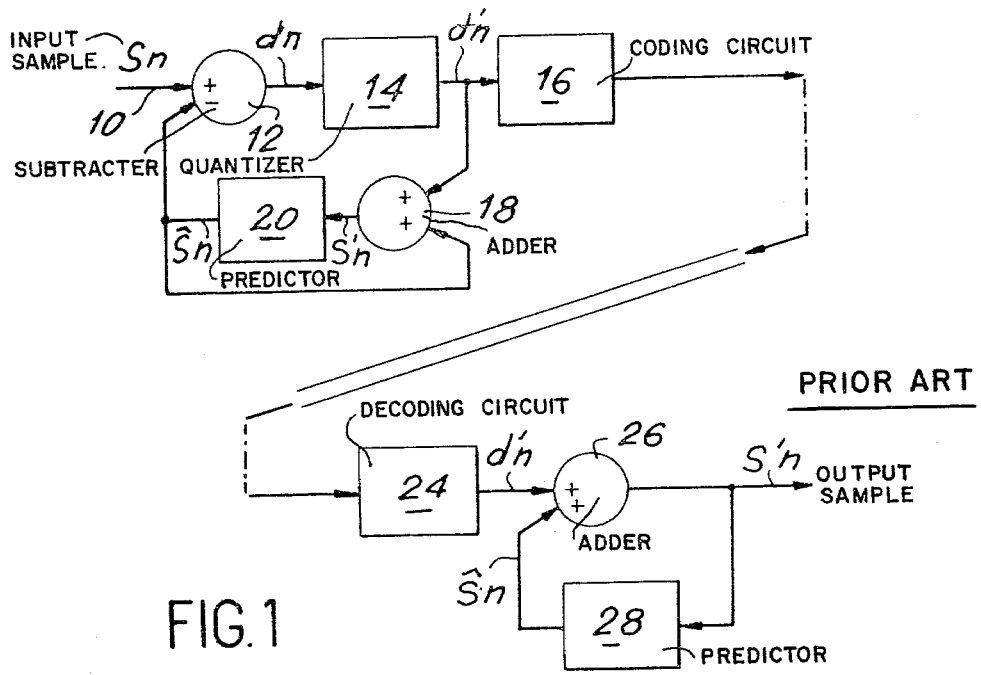
FIG. 1 is a block diagram of a prior art differential-PCM system.
Figure 2:
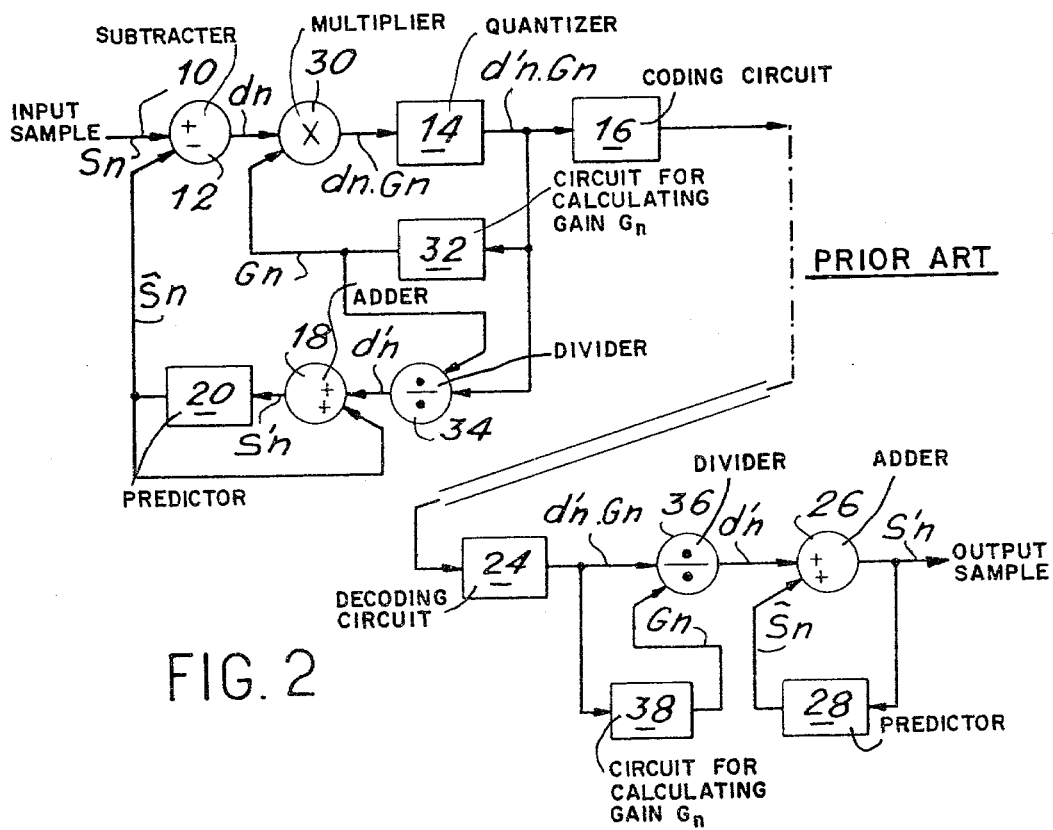
FIG. 2 is a block diagram of the system shown in FIG. 1 supplemented by means for adapting the dynamics of the input signal to the quantizer.

FIGS. 1 and 2 have already been described with reference to the prior art and will not further be described here. It is merely pointed out that to the extent that the circuit according to the invention is a differential-PCM system with adaptation of the dynamics of the signal to the quantizer its general organization is in accordance with FIG. 2. Diagrams of the present invention are shown in FIGS. 3 and 4.

Figure 3:
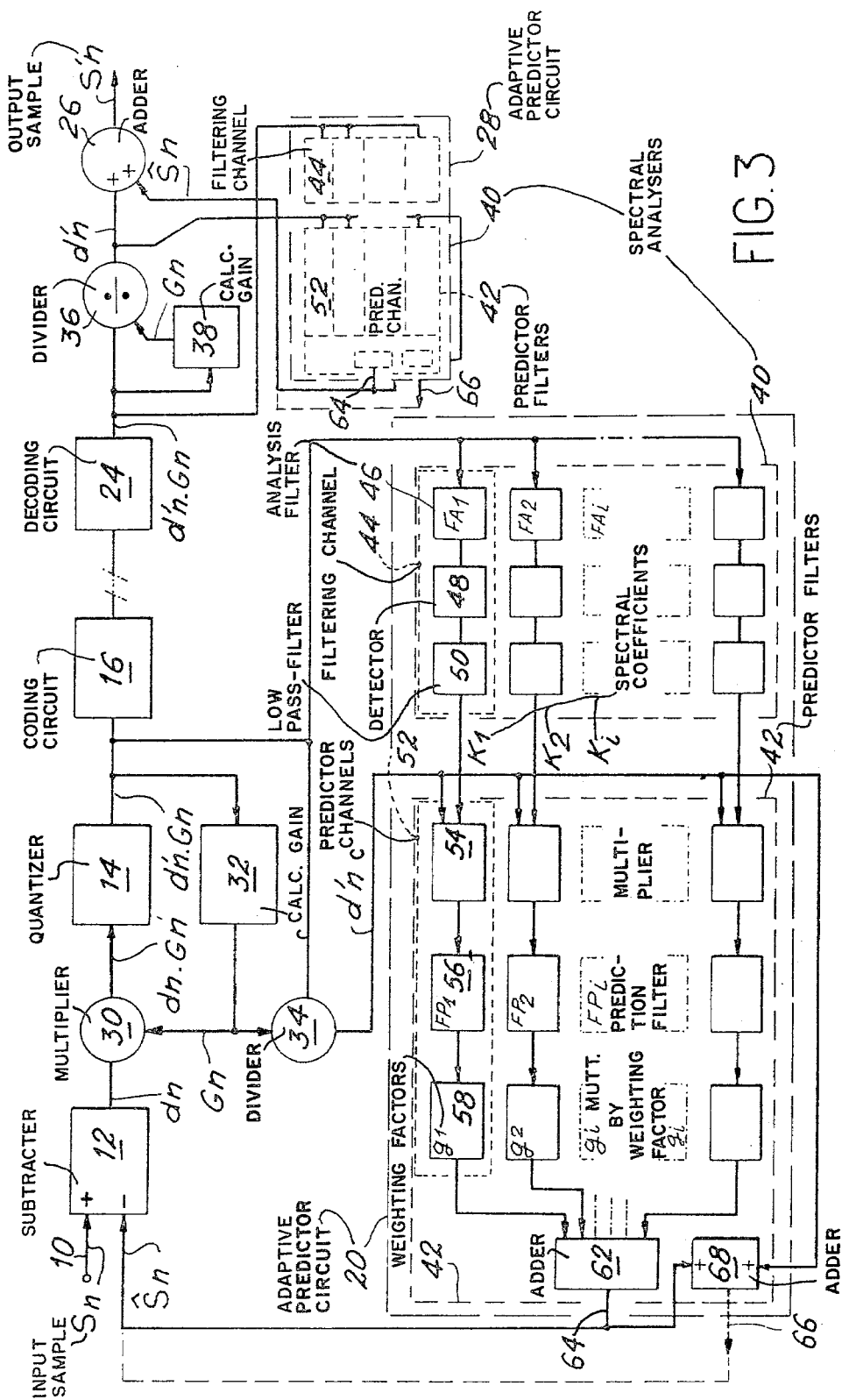
FIG. 3 is a block diagram of an adapted prediction differential-PCM system according to the invention.
Figure 4:
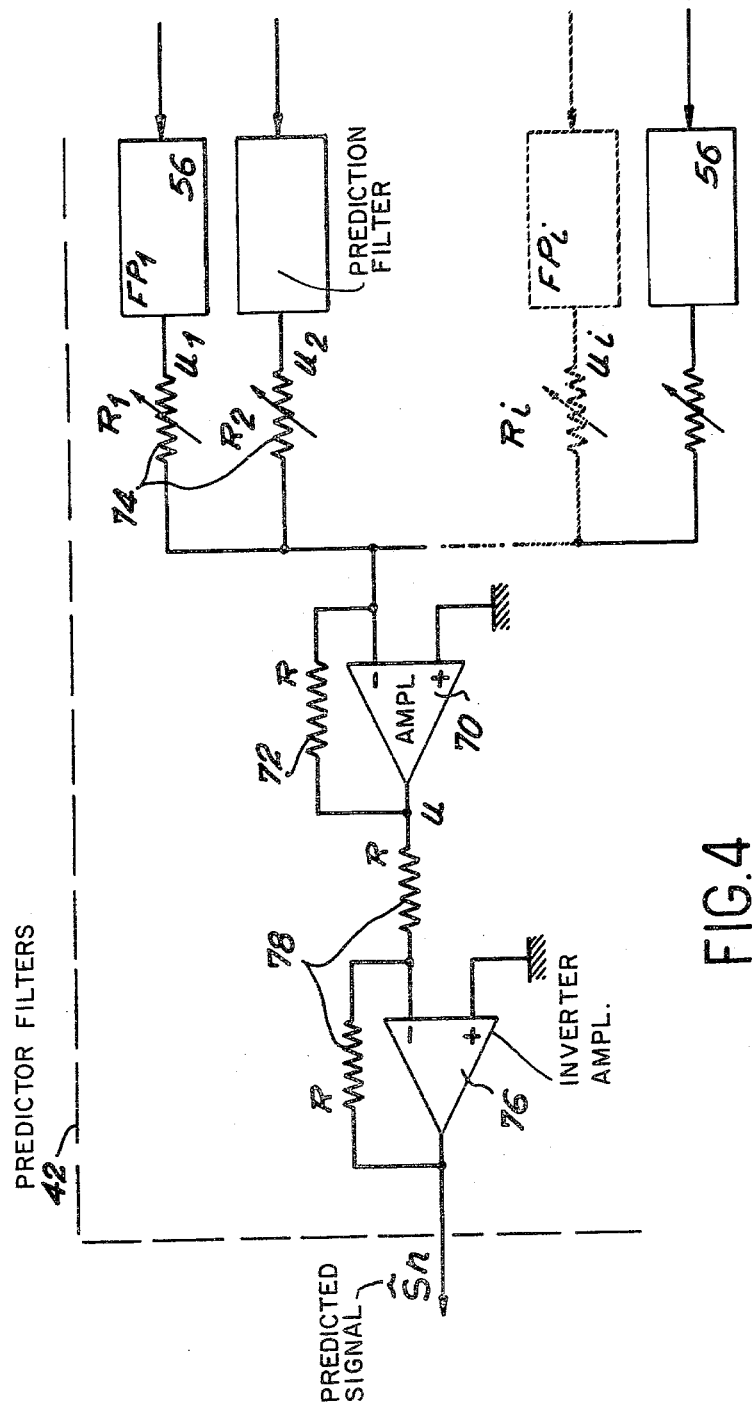
FIG. 4 is a special embodiment of the weighting and addition means for the output signals of the predictor filters utilized in the invention.

FIG. 3 includes certain elements already show in FIG. 2 and for reasons of simplification the same reference numerals will be used. These elements include used for these. These are in the coding stage the differential signal formation circuit 12, the quantizer 14, coder 15, amplifier 30, gain calculating circuit 32, divider 34 and, in the case of the decoding stage; decoder 24, adder 26, divider 36 and gain determination circuit 38.

The essential means of the invention relate to the adaptive predictor circuit, designated by reference numeral 20 in the coding stage and 28 in the decoding stage. The structures of the two predictor circuits are identical, and therefore only that of the coding stage will be described.

The adaptive predictor shown in FIG. 3 essentially comprises a spectral analyser 40 and a group of predictor filters 42, which will be described in turn.

The spectral analyser 40 has parallel filtering channels 44, each of which includes an analysis filter 46, which is of the band pass type and is designated hereinafter by filter $FA_i$. The symbol i designates the rank of the channel. The group of filters $FA_i$ covers the telephone frequency band. Each channel also includes a detector circuit 48, followed by a low pass filter 50. These various channels receive the signal d'n.Gn from quantizer 14. Each channel of rank i supplies a signal Ki, which represents the component of the quantized signal d'n.Gn in the analysis band $FA_i$. The gain of the low pass filters is fixed so that d'n.Ki=d'n when the input signal is a sine curve at the central frequency of filters $FA_i$ and FPi (in order words, in this case Ki=1).

The group of predictor filters 42 has the same number of channels 52 as the spectral analysis circuit 40 has channels 44. Each channel 42 includes a multiplier 54 followed by a band pass filter 56, designated hereinafter as prediction filter $FP_i$, the symbol i designating the rank of the prediction channel. The band pass filters $FP_i$ are adjacent and cover the telephone band, and their central frequency is equal to the central frequency of the preceding filters $FA_i$. Each channel also includes a multiplier 58 by a weighting factor $g_i$. As indicated hereinbefore, the signals $g_i$ are regulated so as to obtain for each prediction filter a maximum loop gain which is compatible with the stability of the system. This arrangement ensures an optimum prediction gain at all frequencies.

Each of the channels 52 has two inputs, one receiving the signal Ki supplied by the analysis stage which precedes it and the other receiving the quantized signal d'n supplied by the circuit 34 for dividing by Gn. Each channel 52 has an output, and all the outputs of these channels are connected to an adder 62, whose output has a signal which is the predicted signal $\hat{S}n$, which signal is finally applied to the subtracter 12.

In addition, the predictor can be provided with two outputs, one output 64 which is that of the adder 62 and the other output 66 which is obtained after addition in an adder 68, which receives the $\hat{S}n$ signal from the adder 62 and the quantized difference d'n. Its two outputs are substantially equivalent from the standpoint of the measured signal/noise ratio, but the latter output ratio is slightly better. It ensures a uniform transfer function, as well as a fixed minimum delay (equal to the time necessary for quantizing dn) throughout the telephone band.

The circuit shown FIG. 3 operates in the following manner. The weighting coefficients Ki characterize the result of the spectral analysis of the signal in each of the bands $FA_i$ (Ki is equal to unity when the input signal has a frequency fi which corresponds to the central frequency of analysis filters $FA_i$ and predictor $FP_i$). This analysis takes place on signal d'n.Gn, i.e., before the division by gain Gn and consequently at constant energy. The variations of Ki are therefore dependent only on the variations in the shape of the spectral envelope of d'n, and not on amplitude translations of the envelope. The adaptations due to the coefficients Ki must in fact act only on the shape of the transfer function of the predictor filter, and not on its gain, the adaptation function of the gain Gn being effected solely as a function of criteria linked with levels occupied in the quantizer.

The signals Ki are then used as weighting coefficients for each of the following prediction channels. It is by the interplay of the coefficients Ki (which reflect the spectral characteristics of the input signal) that the predictor according to the invention has its overall transfer function adapted permanently to the spectrum of the signal to be transmitted.

With regard to the adaptation of the dynamics of the input signal to the quantizer, it can be carried out as in the prior art by analyzing the levels occupied in the quantizer. The same data are then available on transmission and on reception and therefore do not require parallel transmission. A random gain adaptation strategy can be used. If the level occupied by the sample of rank n is designated by the symbol $|Nn|$ passing from 0 to 7 for a 16 level quantizer with the levels distributed on either side of 0, it is possible for example to adopt the following strategy:

if $|N_{n-1}| = |Nn| = 7$, then Gn+1 = Gn−2dB;

if $|Nn| = 6$, then Gn+1 = Gn if $|N_{n-1}|$ at $|Nn| < 6$, then Gn+1 = Gn+0.25 dB.

This strategy is well adapted to the average time evolution of envelopes of voice sounds: rapid rise, short hold (having a stabilizing action), and slower fall, but obviously other strategies are also possible.

FIG. 4 shows a special embodiment of the weighting and adding means for the output signals of the predictor filters. These means comprise an amplifier 70 having a counter-coupled resistor 72 of value R, the reverse input of the amplifier being connected to the output of predictor filters 56 by resistors 74 of values $R_1, R_2 \ldots R_i$ respectively for the channels, $FP_1, FP_2 \ldots FP_i$. The system thus constitutes an amplifier-adder circuit which supplies a signal:

$$u = -(u_1 R/R_1 + u_2 R/R_2 + \ldots u_i R/R_i + \ldots)$$

with $g_i = R/R_1$, $g_2 = R/R_2$, ... $g_i = R/R_i$.

An inverter amplifier 76 having two equal resistors 78 completes the system. This amplifier supplies the predicted signal $\hat{S}n$, which equals −u.

In an explanatory and non-limitative manner, it is pointed out that the Applicant has devised a representative circuit according to the invention with the following characteristics: the number of prediction analysis channels is 6. The central frequencies of the predictor filters and the analysis filters are distributed in a geometrical progression in the telephone band (300 to 3400 Hz). The adjacent filters have a cut-off at −3 dB. The two extreme cut-off frequencies are at 300 and 3400 Hz. Central frequencies of the filters are as follows: 367 Hz; 551 Hz; 825 Hz; 1237 Hz; 1853 Hz; 2778 Hz.

The coefficients Ki vary from 0 to 1. For coefficients $g_i$ the orders of magnitude are as follows: $g_1 = 15$; $g_2 = 11$, $g_3 = 5$; $g_4 = 2.6$; $g_5 = 1.7$; $g_6 = 1$. The gain $g_i$ varies between 1 and 625, i.e. between 0 and +56 dB per one or two dB band.

The cut-off frequencies of the low pass filters are approximately 33 Hz. The groups of filters are active filters (operational amplifier associated with RC networks). The main performances are as follows:

Signal/noise ratio in sinusoidal response: 300 Hz; 46 dB; 500 Hz; 43.5 dB; 800 Hz; 41 dB; 1000 Hz; 38 dB; 1500 Hz; 33 dB; 2000 Hz; 30 dB; 2500 Hz; 25 dB; 3000 Hz; 22 dB.

These performances are maintained on an amplitude variation range of 40 dB (with a differential PCM coder with fixed predictor, these performances would be lower by at least 10 dB.)

Signal/noise ratio for white noise between 350 and 550 Hz: 40 dB. This measurement is standardized for PCM coding. 38 dB is obtained for the 8 bit PCM (64 kbits/s), and 32 dB for the 7 bit PCM (56 kbits/s).

For a speech signal: isopreference signal/noise ratio approximately 33 dB (32 dB for 7 bit PCM at 56 kbit/s) with high fidelity listening and transmission conditions (with a telephone at each end it is not possible to detect any difference between the uncoded signal and the coded signal).

4800 bit/s data signals were transmitted into the device (1800 Hz carrier, 8 state phase modulation, modem with manual equalization), and no error was introduced by the device during a 45 minute test.

The invention is not limited to the embodiments described and represented hereinbefore and various modifications can be made thereto without passing beyond the scope of the invention.

What is claimed is:

1. A transmission method of the adaptive prediction differential-PCM type comprising (a) a coding operation comprising the steps of:

providing a series of samples Sn, where n designates the order or position of a sample within the series;

forming a differential signal dn by subtracting from a sample Sn a signal Ŝn, which signal Ŝn is predicted from the evolution of a differential signal;

multiplying the signal dn by a factor Gn determined from the level occupied by a quantized signal, thereby forming a signal dn.Gn;

quantizing the signal dn.Gn, thereby forming a quantized signal d'n.Gn;

coding the quantized signal d'n.Gn to form a coded signal; and (b) a decoding operation comprising the steps of:

decoding the coded signal to form a quantized signal d'n.Gn;

dividing the quantized signal d'n.Gn by a factor Gn determined from the quantized signal, thereby forming a signal d'n; and forming an aggregate signal S'n by adding the signal d'n to a signal Ŝn, which signal Ŝn is predicted from the evolution of an aggregate signal; wherein each prediction is carried out in adjacent frequency bands on as many signals as are obtained by weighting a quantized signal by coefficients obtained from a spectral analysis in the bands of a quantized signal.

2. A transmission method according to claim 1 wherein the spectral analysis is performed on a quantized signal in a series of analysis frequency bands $FA_i$, where i designates the order or position of a frequency band within the series of frequency bands; wherein the spectral analysis results in a series of spectral coefficients $K_i$; wherein the prediction includes multiplying a quantized signal by each spectral coefficient $K_i$ and filtering the signal thus obtained in a prediction frequency band $FP_i$, each prediction frequency band having approximately the same frequency as a corresponding analysis frequency band and the prediction frequency bands being adjacent, and summating the signals obtained after filtering thereby forming an aggregate signal.

3. A transmission method according to claim 1 wherein each of the signals obtained after filtering is multiplied by a regulatable factor $g_i$ calculated to obtain the maximum loop gain compatible with the stability of the prediction system.

4. A transmission method according to claim 1 wherein the spectral analysis is performed by filtering the quantized signal through a frequency band filter and then passing the filtered signal through a detection circuit and a low pass filter.

5. A transmission circuit of the adaptive prediction differential-PCM type comprising (a) a coding circuit comprising means for providing a series of samples Sn, where n designates the order or position of a sample within the series;

means for forming a differential signal dn by subtracting from a sample Sn a signal Ŝn, which signal Ŝn, is predicted from the evolution of a differential signal;

means for multiplying the signal dn by a factor Gn for thereby forming a signal dn.Gn;

means for quantizing the signal dn.Gn for thereby forming a quantized signal d'n.Gn;

means for providing the signal Ŝn in response to a quantized signal;

means for determining the factor Gn in response to a quantized signal;

means for coding the quantized signal d'n.Gn for thereby forming a coded signal; and (b) a decoding circuit comprising means for receiving the coded signal and for forming an intermediate signal d'n.Gn;

means for dividing the signal d'n.Gn by a factor Gn and for thereby forming a signal d'n;

means for forming an aggregate signal S'n by adding the signal d'n to a signal Ŝn;

means for providing the signal Ŝn in response to an intermediate signal; and means for determining the factor Gn in response to an intermediate signal, wherein the means for providing the signal Ŝn in response to a quantized signal and the means for providing the signal Ŝn in response to an intermediate signal each include a spectral analyzer and a predictor, the spectral analyzer having a series of channels working in a frequency band $FA_i$, where i designates the order or position of a frequency band within the series of frequency bands, and the channels providing a series of spectral coefficients $K_i$, the predictor having a series of channels corresponding to the series of spectral analyzer channels and each predictor channel having a multiplier for multiplying the signal d'n by a spectral coefficient $K_i$ to thereby form a signal Ki d'n, a band pass prediction filter $FP_i$, the bands of the filters having approximately the same central frequency as the spectral analysis frequency bands, and the predictor frequency bands being adjacent, and an adder for aggregating the output of each prediction channel and for providing the signal Ŝn.

6. A transmission circuit according to claim 5 wherein each predictor channel has a multiplier for multiplying the signal passing through a band pass filter $FP_i$ by a regulatable factor $g_i$ calculated to obtain the maximum loop gain compatible with the stability of the prediction system.

7. A transmission circuit according to claim 5 wherein each spectral analyzer channel has a band pass filter, a rectifier and a low pass filter.

8. A transmission circuit according to claim 7 wherein the central frequencies of the spectral analyzer channel frequency bands $FA_i$ and of the prediction channel band pass prediction filters $FP_i$ are in geometric progression.

* * * * *